US006204565B1

United States Patent
Shimoto et al.

(10) Patent No.: US 6,204,565 B1
(45) Date of Patent: Mar. 20, 2001

(54) SEMICONDUCTOR CARRIER AND METHOD FOR MANUFACTURING THE SAME

(75) Inventors: Tadanori Shimoto; Koji Matsui, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/329,838

(22) Filed: Jun. 10, 1999

(30) Foreign Application Priority Data

Jun. 10, 1998 (JP) .................................................. 10-162091

(51) Int. Cl.$^7$ .................................................. H01L 23/532
(52) U.S. Cl. .............................................. 257/783; 257/782
(58) Field of Search ................................. 257/782; 1/783

(56) References Cited

U.S. PATENT DOCUMENTS 4,769,399 * 9/1988 Schenz .................................. 523/213

FOREIGN PATENT DOCUMENTS

| 59-22393 | 2/1984 | (JP) . |
| 3-177034 | 8/1991 | (JP) . |
| 4-292611 | 10/1992 | (JP) . |
| 4-337380 | 11/1992 | (JP) . |
| 5-11451 | 1/1993 | (JP) . |
| 5-11452 | 1/1993 | (JP) . |
| 5-259223 | 10/1993 | (JP) . |
| 5-327224 | 12/1993 | (JP) . |
| 6-19134 | 1/1994 | (JP) . |
| 6-27660 | 2/1994 | (JP) . |
| 6-334343 | 12/1994 | (JP) . |
| 9-116267 | 5/1997 | (JP) . |
| 9-214141 | 8/1997 | (JP) . |
| 9-219590 | 8/1997 | (JP) . |

OTHER PUBLICATIONS

Abstract—pub–No. SU 598916A, Derwent database, Feb. 1978, one page, Akutin et al.*

1996 Electronic Components and Technology Conference pp. 727–732, "Development of Molded Fine–Pitch Ball Grid Array (FPBGA) Using Through–Hole Bonding Process", Matsuda et al.

* cited by examiner

*Primary Examiner*—David Mis

(57) ABSTRACT

A semiconductor carrier is provided with a through hole bump. The bump is formed by coating a photosensitive adhesive consisting of an epoxy acrylate having a fluorene skeleton or polybenzoxazole over a support substrate having a conductive interconnection pattern, exposing and developing the adhesive for forming a through hole therein, and plating for filling a metal within the through hole. The photosensitive adhesive is preferably heated at 80–160° C. prior to the plating process if it comprises the epoxy acrylate having a fluorene skeleton and at 80–250° C. if it comprises the polybenzoxazole.

5 Claims, 3 Drawing Sheets

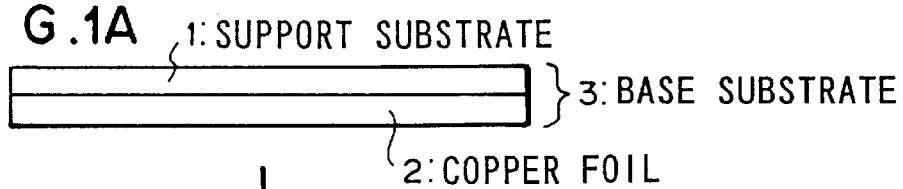
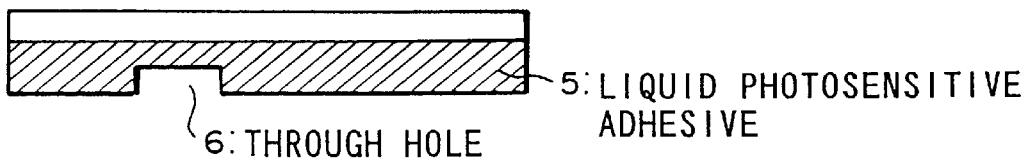
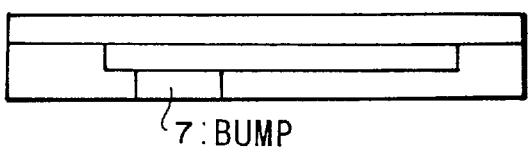
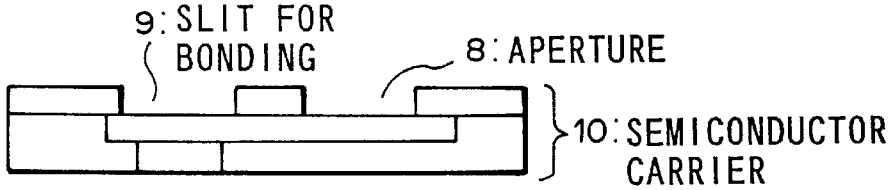
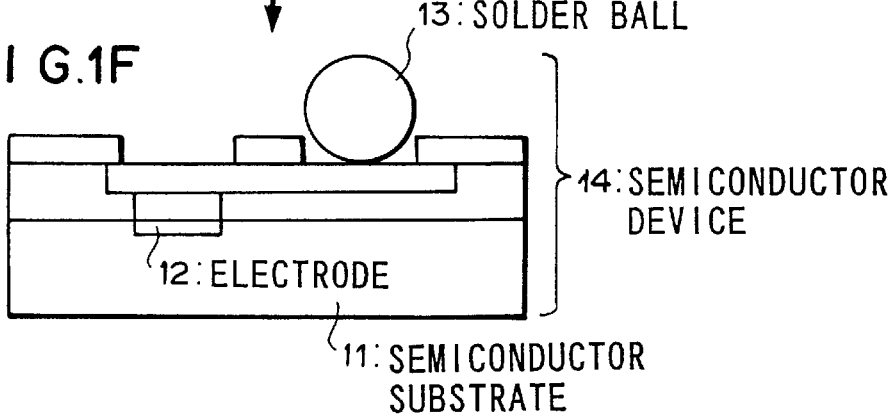

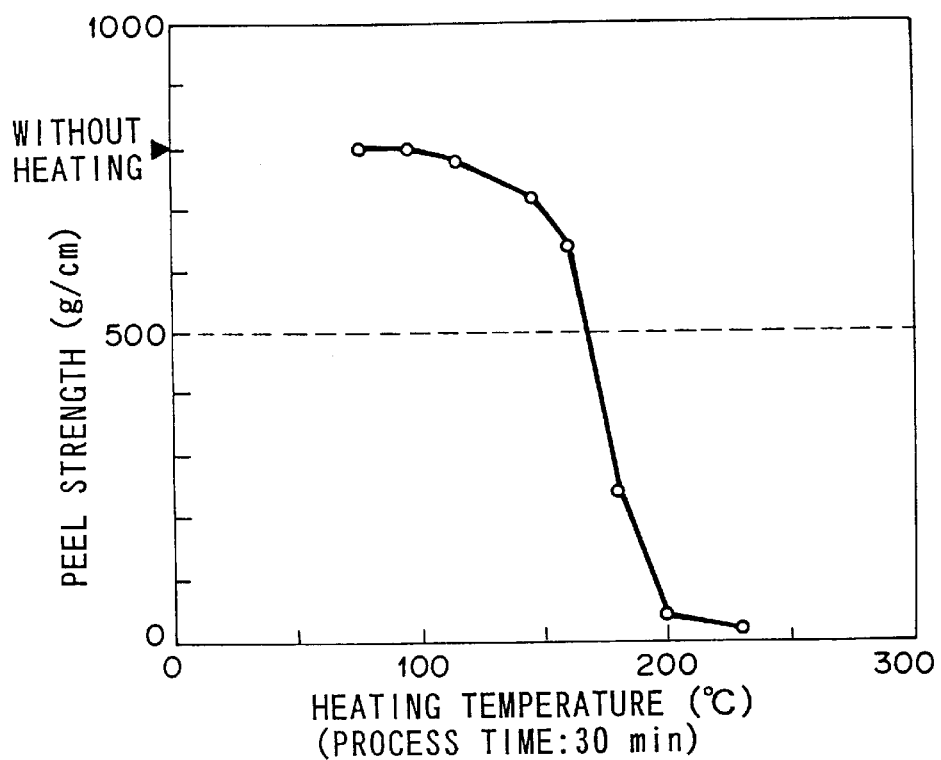
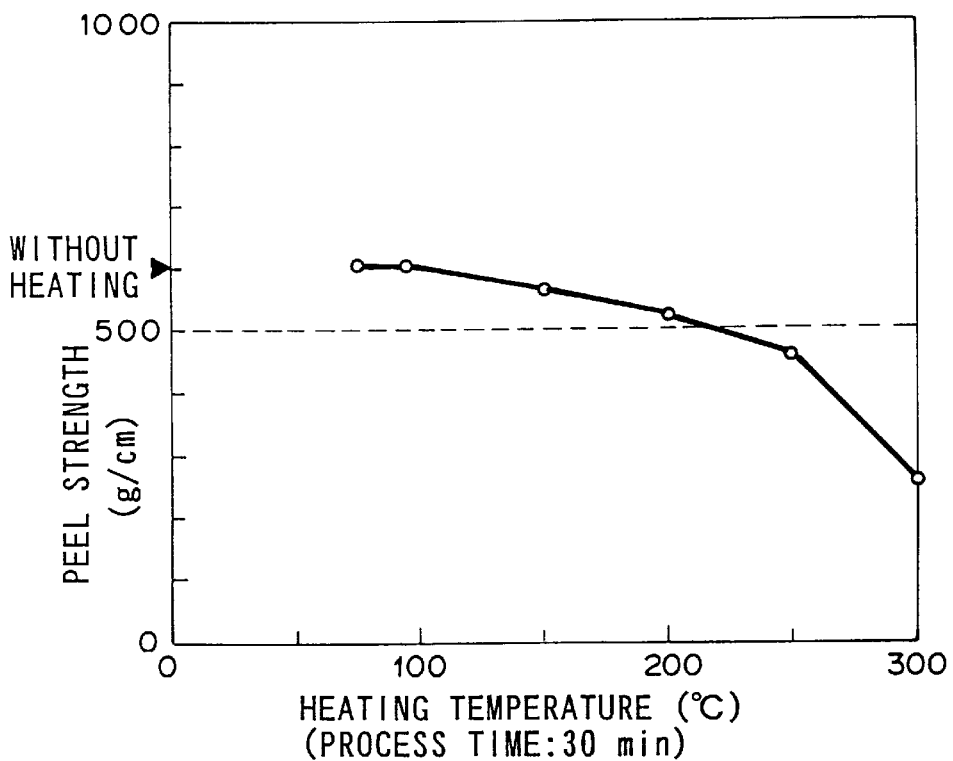

SEMICONDUCTOR CARRIER AND METHOD FOR MANUFACTURING THE SAME

BACKGROUND OF THE INVENTION

1. Field of the Invention

The present invention relates to a semiconductor carrier suitable for mounting a semiconductor device with a high density and method for manufacturing the same.

2. Description of the Related Art

The semiconductor carrier for mounting the semiconductor device is known in the art, for example, as disclosed in the "Electric Component & Technology Conference", No. 46, pp. 727–732. FIG. 4 depicts a cross section of the carrier, in which a copper interconnection pattern 41, a base layer 42 consisting of a polyimide film, and an adhesive layer 43 consisting of a thermoplastic polyimide construct a tape substrate 44. A through hole bump 45 to be connected electrically with a chip is formed in the tape substrate 44. A cover resist layer 48, which includes an aperture 46 for connecting the semiconductor carrier with a mount board electrically and a slit 47 for bonding, is formed on the copper interconnection pattern 41.

In the above-mentioned conventional semiconductor carrier, a substance of the adhesive layer 43 and a technology for forming a through hole in the base layer 42 and adhesive layer 43 to form the through hole bump 45 greatly affect the performance and reliability of the semiconductor carrier. Essential properties required for the adhesive layer 43 are an advantageous heat resistance, moisture resistance, adhesion and low stress which enable to endure various treatments suffered from post-processes such as a process for mounting the semiconductor carrier on the mount board as well as a drug resistance without degrading its characteristics through plating and cleaning processes.

On the other hand, the through hole forming method for forming the through hole bump 45 also greatly affects the performance and reliability of the semiconductor carrier. A method using a laser such as an excimer, carbonic acid gas or YAG laser is generally well known as the through hole forming method. In the method, however, process conditions are unstable so that an etching remainder or sludge may be left on the via bottom. The method further includes a disadvantage that a reliable bump can not be formed because a thermal damage is given to a surface of the copper interconnection pattern 41 according to a type of the laser, resulting in an unstable adhesion of the interface between the copper interconnection pattern 41 and the through hole bump 45.

The formation of the through hole by the laser reduces the throughput and makes a limitation for the yield. In addition, it is not suitable for the mass production and is disadvantageous with respect to the cost. Further, the carbonic acid gas laser and YAG laser are difficult to form a fine through hole because of their long wavelengths. It is desirable for the method as the means to solve such the disadvantages that the adhesive layer 43 has a photosensitivity and that the through hole is formed by the conventional photolithography process.

There is a subject under consideration to construct the semiconductor carrier with an adhesive that has the advantageous heat resistance, moisture resistance, adhesion, low stress and drug resistance as described above. The adhesive should also have the photosensitivity and advantageous resolution, and enable to form a fine through hole by the conventional photolithography process.

The known adhesives with photosensitivity include those of polyimide series as disclosed in JPA 4-337380 and those of epoxy series as disclosed in JPA 6-19134 and JPA 6-27660.

The photosensitive adhesive of polyimide series, however, has a particularly large contraction stress caused during setting. The stress affects to bend the semiconductor carrier unfavorably, and prevents a practical semiconductor carrier to be formed. On the other hand, the photosensitive adhesive of epoxy series is difficult to form a reliable semiconductor carrier because of its essential disadvantage in the heat resistance and moisture resistance. In addition, it has a low resolution and is not suitable for forming the fine through hole.

SUMMARY OF THE INVENTION

An object of the present invention is to solve the above disadvantages.

The present invention is provided with a semiconductor carrier having a bump formed by coating a photosensitive adhesive consisting of an epoxy acrylate having a fluorene skeleton or polybenzoxazole over a support substrate having a conductive interconnection pattern, exposing and developing the adhesive for forming a through hole therein, and plating for filling a metal within the through hole.

The epoxy acrylate having a fluorene skeleton preferably comprises a material represented by the following general formula (I):

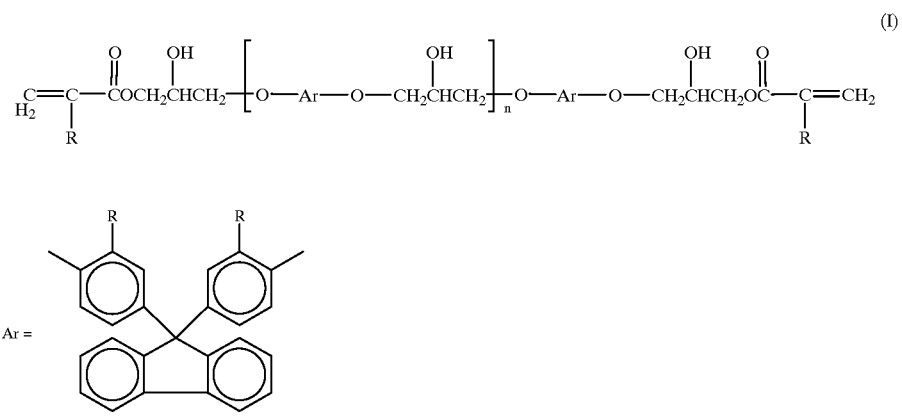

where R is a hydrogen atom or low-grade alkyl group, and n is an integer of 0–20.

The material for an optical usage is disclosed in JPA 4-292611.

The polybenzoxazole is preferably selected from those disclosed in JPA 5-11451 and JPA 5-11452.

The epoxy acrylate having a fluorene skeleton and the polybenzoxazole are the most suitable for the use of the above photosensitive adhesive because they have an advantageous heat resistance, moisture resistance, adhesion and drug resistance. They also have a low stress because of their small contraction during setting. They further enable to form a fine through hole by the conventional photolithography process because of their photosensitivity.

If the photosensitive adhesive is the epoxy acrylate having a fluorene skeleton, coating it on a support substrate having a conductive interconnection pattern, opening a hole in it by exposing and developing processes, and thereafter heating it at a temperature of 80–160° C. or at a temperature of 80–250° C. if the photosensitive adhesive is the polybenzoxazole. Through these processes, it becomes apparent that an advantageous semiconductor carrier may be obtained, which can sustain the adhesion of the adhesive, prevent the degradation of characteristics due to the affection from the post-process such as the plating process, and fabricate the semiconductor device with ease.

Other features and advantages of the invention will be apparent from the following description of the preferred embodiments thereof.

BRIEF DESCRIPTION OF THE DRAWINGS

The present invention will be more fully understood from the following detailed description with reference to the accompanying drawings in which:

FIGS. 1A–1F show a process diagram of an example of a manufacturing process of a semiconductor carrier of the present invention;

FIG. 2 is a graph showing a relationship between a heating temperature and an adhesive force when an epoxy acrylate having a fluorene skeleton is used as a photosensitive adhesive;

FIG. 3 is a graph showing a relationship between a heating temperature and an adhesive force when a polybenzoxazole is used as a photosensitive adhesive.

DETAILED DESCRIPTION OF THE PREFERRED EMBODIMENTS

Figure 4:
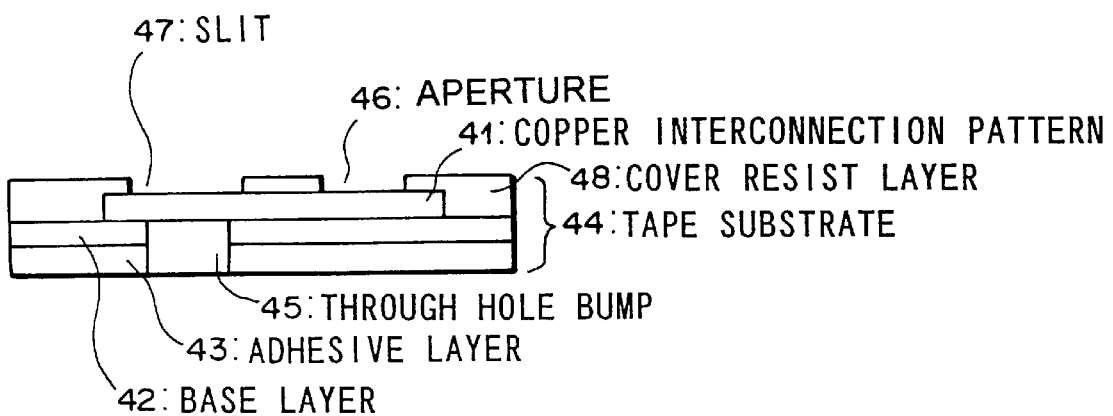
FIG. 4 is a schematic cross sectional view of a semiconductor carrier in the art.

Embodiments of the present invention will be described next with reference to the drawings.

FIGS. 1A–1F show a process diagram of an example of a manufacturing process of a semiconductor carrier having a bump formed by coating a photosensitive adhesive over a support substrate having a conductive interconnection pattern, exposing and developing the adhesive for forming a through hole therein, and plating for filling a metal within the through hole.

A base substrate 3 that consists of a support substrate 1 and a copper foil 2 is prepared first (FIG. 1(a)). The copper foil 2 is etched into a predetermined shape by a photolithography process to form a copper interconnection pattern 4 (FIG. 1(b)).

A liquid photosensitive adhesive 5 consisting of an epoxy acrylate having a fluorene skeleton or polybenzoxazole is coated next over a surface of the copper interconnection pattern 4 by a method such as spin coating, die coating, curtain coating and printing. It is then dried at 75° C. for 20 minutes. Thereafter, it is exposed at 600 mJ/cm$^2$ and developed by dipping in an aqueous solution of 1% sodium carbonate for 3 minutes to form a through hole 6 (FIG. 1(c)).

The photosensitive adhesive may also be a dry film type. Such photosensitive adhesive 5 of the dry film type is laminated on the surface of the copper interconnection pattern 4 with heating, thereafter exposed and developed to form the through hole 6 as well as in the case of the liquid type. Then, filling the through hole 6 with a metal by the plating method or the like may form a bump 7 (FIG. 1(d)).

A semiconductor carrier 10 is finally obtained by forming, on the support substrate 1, an aperture 8 for mounting a solder ball 13 or the like and a slit 9 for bonding, with a chemical etching or laser technology (FIG. 1(e)). The support substrate 1 is made of any material that enables to form the aperture 8 and the bonding slit 9 by the chemical etching or laser technology, such as a polyimide film, epoxy film, glass cloth immersed printed circuit board and aramid non-woven cloth immersed printed circuit board which have suitably excellent workability.

The photosensitive adhesive 5 consisting of an epoxy acrylate having a fluorene skeleton or polybenzoxazole has an excellent resolution and thus is advantageous in forming the fine through hole 6 with a high aspect ratio. It is confirmed that the bump 7 has an excellent reliability of a junction with the copper interconnection pattern 4. This is because no damage to the copper interconnection pattern 4 is caused and no remainder and residue of the bottom of the through hole 6 is present, which are caused when the laser is used.

Coupling a semiconductor substrate 11 with the photosensitive adhesive 5 mechanically and making a junction between an electrode 12 of the semiconductor substrate 11 and the bump 7 electrically may fabricate a semiconductor device 14, as shown in FIG. 1(f), which has an excellent reliability because the photosensitive adhesive 5 has the advantageous heat resistance, moisture resistance, adhesion and drug resistance.

If the standing state before the plating process is not good and the standing time is too long, the photosensitive adhesive 5 may absorb moisture, promote the degradation by the post-process such as the plating process and reduce the adhesion to the semiconductor substrate 11 in the worst case. After considerations to resolve this problem, the inventors found that performing a heat treatment after the formation of the photosensitive adhesive 5 having the through hole 6 and prior to the plating process to form the bump 7 may prevent the degradation of the characteristics due to the post-processes including the plating process with sustaining the adhesion of the adhesive, and can form the semiconductor carrier excellent for fabricating the semiconductor device. In this case, conditions for the heat treatment are important.

FIG. 2 shows a relationship between an adhesive force (peel strength) to the semiconductor substrate 11 and a heating time (process time: 30 minutes) when the epoxy acrylate having a fluorene skeleton is used as the photosensitive adhesive 5. The peel strength exhibits 800 g/cm without heating and reduces sharply at heating temperatures of 160° C. or more. On the other hand, a heat treatment at heating temperatures of 80° C. or less can not achieve the original object to improve the degradation of the characteristics.

Thus, the heat treatment at 80–160° C. is optimum prior to the plating process if the photosensitive adhesive 5 comprises the epoxy acrylate having a fluorene skeleton. The heat treatment at 80–250° C. is similarly optimum if the photosensitive adhesive 5 comprises the polybenzoxazole as obvious from a relationship between a heating temperature and adhesion shown in FIG. 3.

As described above, in the semiconductor carrier according to the present invention, the bump is formed by coating the photosensitive adhesive consisting of an epoxy acrylate having a fluorene skeleton or polybenzoxazole over a support substrate having a conductive interconnection pattern, exposing and developing the adhesive for forming a through hole therein, and plating for filling a metal within the through hole. Therefore, the excellent reliable semiconductor device can be formed. In addition, it is extremely useful for a miniaturized pitch connection because the fine through hole bump can be easily formed.

Further, if the photosensitive adhesive comprises the epoxy acrylate having a fluorene skeleton, coating it on a support substrate having a conductive interconnection pattern, opening a hole in it by exposing and developing processes, and thereafter heating it at a temperature of 80–160° C. or at a temperature of 80–250° C. if the photosensitive adhesive is the polybenzoxazole. Through these processes, an advantageous semiconductor carrier may be obtained which can sustain the adhesion of the adhesive, prevent the degradation of characteristics due to the affection from the post-process such as the plating process, and fabricate the semiconductor device with ease.

Having described the embodiments consistent with the present invention, other embodiments and variations consistent with the present invention will be apparent to those skilled in the art. Therefore, the invention should not be viewed as limited to the disclosed embodiments but rather should be viewed as limited only by the spirit and scope of the appended claims.

What is claimed is:

1. A semiconductor carrier comprising a support substrate having a conductive interconnection pattern, and a bump formed by coating a photosensitive adhesive over said support substrate and said conductive interconnection pattern thereof, exposing and developing said adhesive for forming a through hole therein, and plating for filling a metal within said through hole, wherein said photosensitive adhesive is an adhesive selected from the group consisting of an epoxy acrylate having a fluorine skeleton and polybenzoxazole.

2. The semiconductor carrier of claim 1, wherein said support substrate is a substrate selected from the group consisting of a polyamide film, epoxy film, glass cloth immersed printed circuit board and aramid non-woven cloth immersed printed circuit board.

3. The semiconductor carrier of claim 1, wherein said conductive interconnection pattern is made out of copper.

4. A method for manufacturing a semiconductor carrier including a support substrate having a conductive interconnection pattern, comprising the steps of:

coating a photosensitive adhesive consisting of an epoxy acrylate having a fluorine skeleton on said support substrate and said conductive interconnection pattern thereof;

exposing and developing said adhesive for forming a through hole therein;

thereafter heating at a temperature of 80–160° C.; and then plating for forming a bump by filling a metal within said through hole.

5. A method for manufacturing a semiconductor carrier including a support substrate having a conductive interconnection pattern, comprising the steps of:

coating a photosensitive adhesive consisting of a polybenzoxazole on said support substrate and said conductive interconnection pattern;

exposing and developing said adhesive for forming a through hole therein;

thereafter heating at a temperature of 80–250° C.; and then plating for forming a bump by filling a metal within said through hole.

* * * * *